US011801823B2

(12) United States Patent
Ghanbari Milani et al.

(10) Patent No.: US 11,801,823 B2
(45) Date of Patent: Oct. 31, 2023

(54) COMPUTER-BASED SYSTEM FOR TESTING A SERVER-BASED VEHICLE FUNCTION

(71) Applicant: Robert Bosch GmbH, Stuttgart (DE)

(72) Inventors: Farzaneh Ghanbari Milani, Korntal-Muenchingen (DE); Volker Blaschke, Bietigheim-Bissingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 432 days.

(21) Appl. No.: 16/637,322

(22) PCT Filed: Aug. 3, 2018

(86) PCT No.: PCT/EP2018/071184
§ 371 (c)(1),
(2) Date: Feb. 7, 2020

(87) PCT Pub. No.: WO2019/030146
PCT Pub. Date: Feb. 14, 2019

(65) Prior Publication Data
US 2020/0238970 A1    Jul. 30, 2020

(30) Foreign Application Priority Data

Aug. 8, 2017  (DE) .......................... 102017213823.8
Jul. 27, 2018  (DE) .......................... 102018212560.0

(51) Int. Cl.
*G06F 17/00* (2019.01)
*B60W 20/10* (2016.01)
(Continued)

(52) U.S. Cl.
CPC ............ *B60W 20/10* (2013.01); *B60W 50/00* (2013.01); *G01M 17/007* (2013.01); *G05B 17/02* (2013.01);
(Continued)

(58) Field of Classification Search
CPC ............ B60W 50/02; B60W 2556/45; B60W 2050/046; B60W 50/00;
(Continued)

(56) References Cited

U.S. PATENT DOCUMENTS 7,275,184 B2 *  9/2007  Wolff ................. G06F 11/3684
                                                            714/39
11,216,604 B2 *  1/2022  Cheng ................. G06F 11/079
(Continued)

FOREIGN PATENT DOCUMENTS

CN    104460349 A    3/2015
CN    106605136 A    4/2017
(Continued)

OTHER PUBLICATIONS

Automotive System Testing by Independent Guarded Assertions (Year: 2005).*
(Continued)

*Primary Examiner* — Ronnie M Mancho
(74) *Attorney, Agent, or Firm* — NORTON ROSE FULBRIGHT US LLP; Gerard Messina

(57) ABSTRACT

A computer-based system for testing a server-based vehicle function, which is designed to implement a method comprising the following steps: a function model of the vehicle function is simulated by a first simulator on a server, an at least partial vehicle model is simulated by a second simulator and the vehicle function is tested, while a data connection between the first simulator and the second simulator is systematically influenced.

8 Claims, 2 Drawing Sheets

(51) Int. Cl.
  *B60W 50/00* (2006.01)
  *G01M 17/007* (2006.01)
  *G05B 17/02* (2006.01)
  *B60K 6/20* (2007.10)
(52) U.S. Cl.
  CPC ........ *B60K 6/20* (2013.01); *B60W 2050/0018* (2013.01); *B60W 2050/0031* (2013.01); *B60Y 2200/92* (2013.01)
(58) Field of Classification Search
  CPC . B60W 2050/0018; B60W 2050/0031; B60W 20/10; B60W 2050/0006; G06F 30/20; G06F 2221/034; G06F 30/15; G01M 17/007; G01M 15/02; G05B 17/02; B60K 6/20; B60Y 2200/92
  USPC .......................................................... 701/22
  See application file for complete search history.

(56) References Cited

U.S. PATENT DOCUMENTS

| | | | |
|---|---|---|---|
| 2007/0271079 A1 | 11/2007 | Oguchi et al. | |
| 2014/0244231 A1* | 8/2014 | Paule ................. | G05B 23/0213 703/13 |
| 2015/0121148 A1* | 4/2015 | Hyodo ................ | G06F 11/3636 714/38.1 |
| 2017/0024500 A1* | 1/2017 | Sebastian ................ | G06F 30/20 |
| 2017/0169623 A1* | 6/2017 | Chen ........................ | G07C 5/02 |
| 2017/0206097 A1* | 7/2017 | Gilles ................. | G06F 13/4221 |
| 2018/0308296 A1* | 10/2018 | Dan ...................... | G01M 17/06 |
| 2020/0238970 A1* | 7/2020 | Ghanbari Milani .... | G06F 30/15 |
| 2020/0283009 A1* | 9/2020 | Stählin .................. | B60W 20/00 |

FOREIGN PATENT DOCUMENTS

| | | | |
|---|---|---|---|
| CN | 105700512 B * | 6/2019 | ......... G05B 23/0208 |
| DE | 10303489 A1 | 8/2004 | |
| DE | 102015102284 A1 | 8/2015 | |
| EP | 3121729 A1 | 1/2017 | |

OTHER PUBLICATIONS

International Search Report for PCT/EP2018/071184, dated Nov. 2, 2018.
Pillmann, J. et al., "Car-to-Cloud Communication Traffic Analysis Based on the Common Vehicle Information Model", IEEE 85th Vehicular Technology Conference (VTC Spring), 2017, pp. 1-5.

* cited by examiner

_US 11,801,823 B2_

COMPUTER-BASED SYSTEM FOR TESTING A SERVER-BASED VEHICLE FUNCTION

FIELD

The present invention relates to a computer-based system for testing a server-based vehicle function.

BACKGROUND INFORMATION

Embedded systems rely on valid input signals from sensors and in turn simulate their environment through output signals to a variety of actuators. In the course of the verification and preceding development phases of such a system, its model (model in the loop, MiL), software (software in the loop SiL), processor (processor in the loop, PiL) or its entire hardware (hardware in the loop, HiL) is therefore simulated in a control loop together with a model of the environment. In automotive technology, simulators corresponding to this principle for testing electronic control units are sometimes called component test stands, module test stands or integration test stands, depending on the phase and object of the test.

German Patent No. DE 10303489 A1 describes such a method for testing software of a control unit of a vehicle, in which a test system at least partially simulates a controlled system controllable by a control unit in that the control unit generates output signals, and these output signals of the control unit are transmitted to first hardware components via a first connection, and signals of second hardware components are transmitted as input signals to the control unit via a second connection, the output signals being provided as first control values in the software and additionally being transmitted to the test system via a communication interface in real time with respect to the controlled system.

SUMMARY

The present invention provides a computer-based system for testing a server-based vehicle function.

Example embodiment of the present invention are based on the recognition that in light of continuously rising complexity and a high number of control units in the vehicle it is expedient partially to outsource complex functions. Such outsourcing of suitable vehicle functions into the allegorical "cloud" are able to create an added value for end users and manufacturers and reduce the manufacturing costs of the vehicle itself. Such server-based—"cloud-based" in the following text—functions use the relevant information from the environment and are based, e.g., on complex prediction and decision algorithms.

The functions that are cloud-based in this sense, that is, supported by a server in the cloud, are normally usable by a connectivity control unit (CCU) installed in the vehicle, which networks the control unit relevant for the respective function with the cloud via the mobile telephony network. Furthermore, said control unit sometimes also encompasses a portion of the function in order to implement the totality of the function. That is to say, the cloud-based function may be a function that runs on a server located at a distance from the vehicle, which optionally receives information transmitted from the vehicle, and ascertains a return value (e.g., as a function of the transmitted information). The return value is then transmitted to the vehicle (e.g., to the connectivity control unit). The vehicle is subsequently controlled as a function of this return value. For example, the function may ascertain a control parameter of a hybridized drive train, e.g., in that the proportions of the combustion engine drive and the electric motor drive are ascertained, the vehicle then being controlled in accordance with these proportions.

Example embodiments of the present invention presented below further recognize that the availability of the mobile telephony communication is affected in part by geographic circumstances and is thus not uniform everywhere. For this reason, it is possible that the transmission rate of the data varies greatly depending on the vehicle position, the time of day or the number of other mobile telephony users in the surroundings. Moreover, the mobile telephony connection may be interrupted by an interference in the mobile telephony network. In this case, the cloud-based functions would temporarily not be available for the control unit. A suitable, reduced portion of the function should be implemented within the control unit as a measure of countering this typical behavior of mobile telephony connections.

The test method provided here makes allowance for the fact that because of the described extension of the vehicle functions beyond the vehicle limit into the cloud, the test tools and methods of the related art are often no longer sufficient. A realistic analysis is therefore required of the functions selected for cloud-based applications. Furthermore, it is necessary to evaluate the effects of new components and communication interfaces on the functionality of the cloud-based functions.

One advantage of the approach in accordance with example embodiments of the present invention discussed below accordingly is that it opens the possibility of checking during development whether the selected function is suitable for a cloud application and whether all of the information required for fulfilling the function is provided via the new interface. No test carrier is required for this check so that there is no risk of damaging possible test vehicles. According to the method provided, it is thus possible to test functions even under conditions that are difficult or impossible to create in a real environment.

Furthermore, it is possible to perform different test series in automated and reproducible fashion. This applies in particular to new error patterns due to the behavior of mobile telephony and Internet network systems described above. Thus, according to the approach presented here, it is possible to implement reproducible interference influences for the development and validation of functions.

This makes it possible to test the cloud-based functions with defined effort under the same conditions as embedded functions. Moreover, it is possible to reduce the number and scope of possible test drives drastically since in a controlled laboratory environment it is possible to emulate the scenarios that are critical to the system with respect to the occurring communication patterns.

The measures described herein allow for advantageous further developments and improvements of the present invention. Thus there may be a provision for the respective functions to be tested in a simulation environment with respect to their interfaces and interaction with the remaining functions. In this way, the functions that are not suitable for the cloud application are detected in an early phase of development. This in turn makes it possible to avoid the immense consequential costs caused by a possible erroneous selection.

According to another aspect of the present invention, there may be a provision for systematically influencing and in particular disrupting the mobile telephony connection between the server and the HiL simulator. This may be accomplished in the MiL environment by varying the influence variables. In the process, the consequences of an interruption of the connection for the functionality of the tested function or the entire control system are tested. A corresponding test method is also able to examine the influences of varying transmission rate and latency time on the cloud-based functions in a realistic test environment.

According to another aspect of the present invention, there may be a provision to use new components for example as a connectivity control unit for implementing the cloud-based functions. These may influence the vehicle control directly or indirectly. According to the related art, by contrast, an overall system can normally only be tested using a test vehicle after the cloud-based functions have been transferred into the cloud.

BRIEF DESCRIPTION OF THE DRAWINGS

Exemplary embodiments of the present invention are illustrated in the figures and are explained in greater detail below.

DETAILED DESCRIPTION OF EXAMPLE EMBODIMENTS

Figure 1:
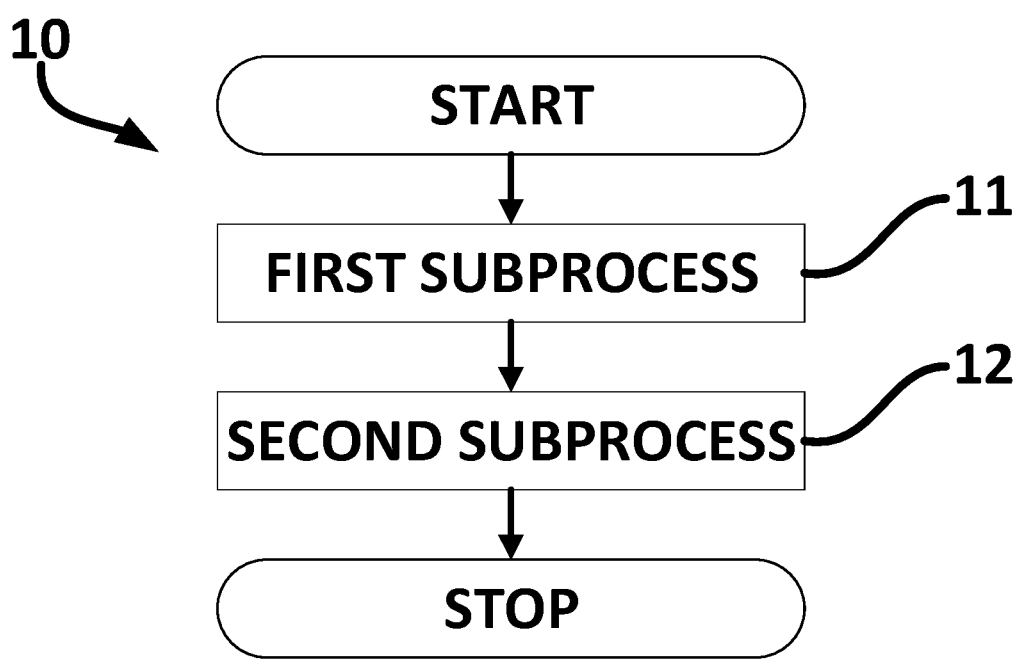
FIG. 1 shows a flow chart of an example method according to one specific embodiment of the present invention.

FIG. 1 illustrates an exemplary test method (10) having two subprocesses (11, 12), which may be used independently of each other.

Figure 2:
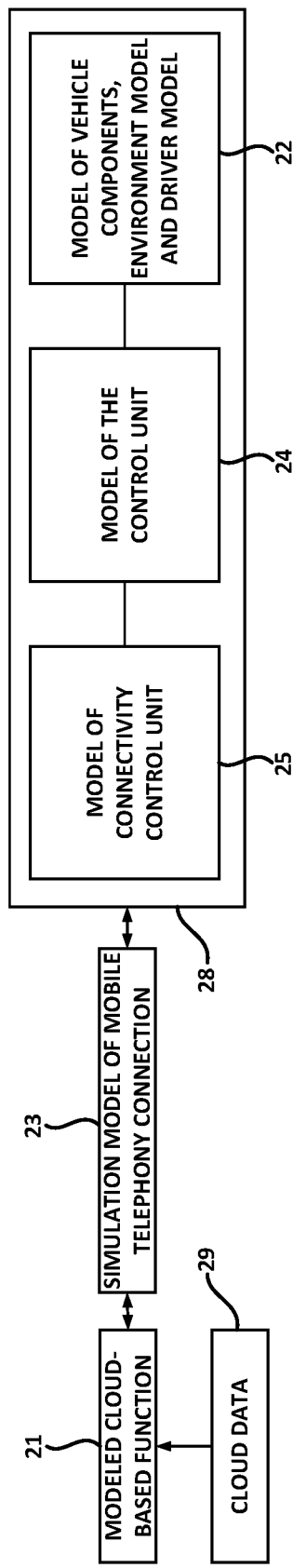
FIG. 2 shows an MiL test environment for cloud-based functions in a schematic representation.

The first subprocess (11) is used in an early phase of development. For this purpose, first the cloud-based function is modeled and in the MiL simulation environment (28), illustrated in FIG. 2, is integrated with simulation models (28) made up of a model (22) of all relevant vehicle components and a relevant environment model and driver model and, respectively, a model (24) of the control unit and a model (25) of the connectivity control unit (CCU). The connection between the modeled cloud-based function (21) and further simulation models (28) is implemented via a simulation model (23) of the mobile telephony connection. The MiL tests run on a computer without control unit hardware and cloud server. This makes it possible to examine the interfaces for completeness and to test various scenarios such as, e.g., the effects of a signal interruption or a variable latency period. The latter may be implemented by varying the influence variables (parameters) in the simulation model of the mobile telephony network. Using this method, it is possible to verify whether the cloud-based functions achieve the added value by using cloud information. For this purpose, the cloud data (29) are modeled as input for the simulation model of the cloud-based function.

Figure 3:
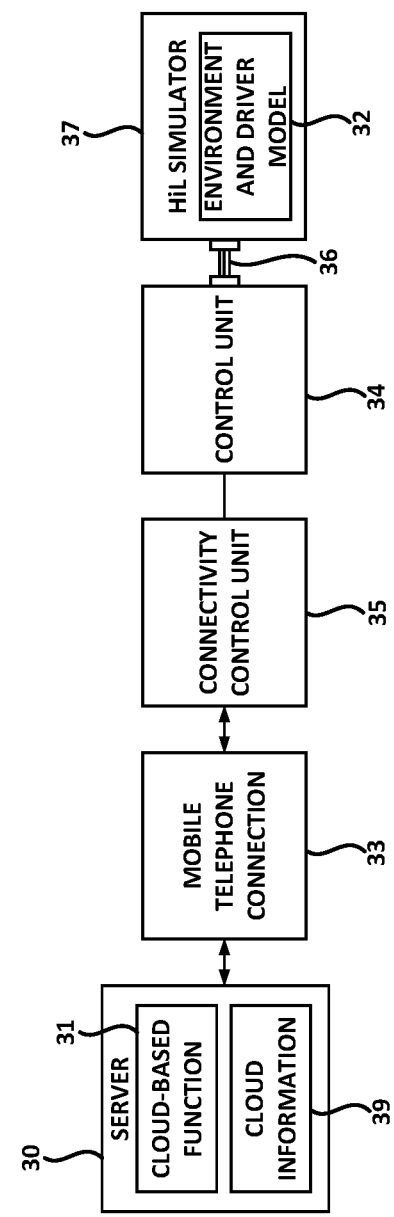
FIG. 3 shows a corresponding HiL test environment for cloud-based functions.

Within the scope of the second subprocess (12), all components from control unit (34) to connectivity control unit (35) and the mobile telephony network to server (30) are subjected to an application-specific test in the HiL test environment shown in FIG. 3. Thus it is possible to test the overall system with respect to various influence factors without a test vehicle.

For this purpose, the function model is simulated on server (30). Server (30) is networked with connectivity control unit (35) via a mobile telephony connection (33). This essentially corresponds to the implementation of the cloud-based function of a real vehicle. A control unit (34) to be tested is connected to an HiL simulator (37) via a cable harness (36). The vehicle, the environment and driver model (32) run in real time on the HiL simulator. Control unit (34) includes the entire software with the exception of the function portions outsourced to server (30). The cloud information (39) that is required for the cloud-based function is stored on server (30). In this subprocess (12), the entire information chain from control unit (34) to the cloud-based function on server (30) may be examined systematically. This method makes it possible to evaluate the effect of the real mobile telephony connection on the functionality of the cloud-based function. Server (30), on which the cloud-based function (31) runs, may be located in a different geographic area such as e.g. a different building or even another country. The control unit (34) to be tested, the connectivity control unit (35) as well as the HiL simulator (37) may be situated in particular in mobile fashion, for example in a test vehicle. By moving this test vehicle, it is then possible to evaluate the effect of the real mobile telephony connection (33) on the functioning of the cloud-based function (31) in interaction with control unit (34) in a particularly realistic manner.

Additionally, in the described exemplary embodiments, it is possible to check the interaction of cloud-based function (31) with the entire control software in control unit (34).

Let it be assumed by way of example that the function for the calculation of the maximally admissible torque of an electric machine is transferred to the cloud in the manner described. In this example, the calculation is to be optimized by route information such as, e.g., the length of the route traveled, the road gradient or the ambient temperature. The maximum torque exerted by the electric motor is used here as input variable for additional functions and plays an important role in the torque distribution between the electric machine and an alternatively provided internal combustion engine.

In the course of the second subprocess, a comparison is possible in this scenario between the torque coordination on the part of the cloud-based function and of the embedded function, as is an interruption of the mobile telephony connection (33) and investigation of its consequences or of the influence of the latency period on the torque coordination.

What is claimed is:

1. A computer-based system for testing a server-based vehicle function, which, running on a server situated at a distance from the vehicle, ascertains a return value, which is transmitted to the vehicle, a vehicle control unit controlling operation of the vehicle as a function of this return value, the computer-based system being configured to implement a method comprising the following steps:

in a first subprocess, using a first simulator to perform a simulation that simulates an execution by the server of a function model of the vehicle function, the simulation being performed without use, during the first subprocess, of the server, without use, during the first subprocess, of the vehicle control unit, without use, during the first subprocess, of a data connection network, and without use, during the first subprocess, of a connectivity control unit that is configured to control data communication between the server and the vehicle control unit over the data connection network;

determining, based on the simulation using the first simulator, whether implementation of the vehicle function using the server provides an added value compared to implementation of the vehicle function locally on the vehicle without the server; and in a second subprocess, subsequent to a result of the determination being obtained which is that the added value is provided, using a second simulator to test the vehicle function by executing the function model on the server by which the server performs the data communication over the data connection network with the connectivity control unit to provide input to the vehicle control unit, in response to which the vehicle control unit provides an output for the controlling operation of the vehicle, wherein:
- the output is trasmitted to a hardware-in-loop (HiL) simulator that simulates the operation of the vehicle with models; and
- the test is performed while an information chain between the vehicle control unit and the server is systematically influenced.

2. The system as recited in claim 1, wherein the first simulator and the second simulator are integrated in a common simulation environment, and the simulation environment includes portions of a control unit model that are relevant for controlling the vehicle function.

3. The system as recited in claim 2, wherein the simulation environment is an individual computer that includes a simulation model of the data communication.

4. The system as recited in claim 1, wherein the data connection network comprises a real mobile telephony connection.

5. The system as recited in claim 1, wherein the connectivity control unit is situated in the vehicle.

6. The system as recited in claim 1, wherein the output of the vehicle control unit is provided to the HiL simulator via a cable harness.

7. The system as recited in claim 1, wherein the server is situated outside of the vehicle and the vehicle control unit and the HiL simulator are situated in the vehicle.

8. The system as recited in claim 6, wherein the vehicle control unit is an engine control unit, and the vehicle function is a torque coordination.

* * * * *